(12) United States Patent
Ashida et al.

(10) Patent No.: US 12,519,449 B2
(45) Date of Patent: Jan. 6, 2026

(54) MULTILAYER ELECTRONIC COMPONENT

(71) Applicant: TDK CORPORATION, Tokyo (JP)

(72) Inventors: Yuta Ashida, Tokyo (JP); Tomonori Terui, Tokyo (JP); Masahiro Tatematsu, Tokyo (JP); Shuhei Sawaguchi, Tokyo (JP); Keigo Shibuya, Tokyo (JP); Tetsuzo Goto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 120 days.

(21) Appl. No.: 18/585,924

(22) Filed: Feb. 23, 2024

(65) Prior Publication Data

US 2024/0291458 A1  Aug. 29, 2024

(30) Foreign Application Priority Data

Feb. 27, 2023  (JP) .................. 2023-028790

(51) Int. Cl.
  *H03H 7/42*  (2006.01)
  *H03H 7/01*  (2006.01)
  *H03H 7/09*  (2006.01)
  *H03H 7/18*  (2006.01)
  *H03H 7/21*  (2006.01)
  *H03H 1/00*  (2006.01)

(52) U.S. Cl.
  CPC ............ *H03H 7/42* (2013.01); *H03H 7/0115* (2013.01); *H03H 7/09* (2013.01); *H03H 7/18* (2013.01); *H03H 7/21* (2013.01); *H03H 2001/0085* (2013.01)

(58) Field of Classification Search
  CPC .... H03H 7/42; H03H 7/09; H03H 2001/0085; H03H 7/18; H03H 7/21
  USPC ...................... 333/25, 26, 175, 185
  See application file for complete search history.

(56) References Cited

U.S. PATENT DOCUMENTS 9,035,717 B2 * 5/2015 Tanaka ................. H03H 7/42
                                                   333/26

FOREIGN PATENT DOCUMENTS

JP  2003-273685 A  9/2003
JP  2019-050460 A  3/2019

* cited by examiner

*Primary Examiner* — Rakesh B Patel
(74) *Attorney, Agent, or Firm* — Oliff PLC

(57) ABSTRACT

An electronic component includes a filter, a first phase-shift circuit, a second phase-shift circuit, and a stack. The first phase-shift circuit includes a first inductor provided in a first path connecting an unbalanced terminal and a first balanced terminal, and a first capacitor provided between the first path and a ground in a circuit configuration. The second phase-shift circuit includes a second capacitor provided in a second path connecting the unbalanced terminal and a second balanced terminal, and a second inductor provided between the second path and the ground in the circuit configuration. The first inductor and the second inductor are arranged in a direction parallel to a stacking direction.

11 Claims, 12 Drawing Sheets

MULTILAYER ELECTRONIC COMPONENT

CROSS REFERENCE TO RELATED APPLICATIONS

This application claims the benefit of Japanese Priority Patent Application No. 2023-28790 filed on Feb. 27, 2023, the entire contents of which are incorporated herein by reference.

BACKGROUND OF THE INVENTION

1. Field of the Invention

The present invention relates to a multilayer electronic component including a balun.

2. Description of the Related Art

An example of an electronic component usable for communication apparatuses, such as compact mobile communication apparatuses typified by cellular phones and smartphones, television broadcast communication apparatuses, and wireless LAN communication apparatuses, is a filter, such as a low-pass filter, a high-pass filter, or a band-pass filter. In the communication apparatuses, there is a case where it is desired that a circuit for handling a balanced signal is connected to a filter for handling an unbalanced signal. In this case, a balun for performing conversion between an unbalanced signal and a balanced signal is conventionally provided between the filter and the circuit for handling a balanced signal.

In recent years, the compact mobile communication apparatuses have particularly achieved greater functionality and further downsizing, and accordingly, downsizing and high mounting densities of electronic components have been achieved. As an electronic component for enabling high mounting density, an electronic component integrating a filter with a balun is known.

JP 2003-273685 A discloses a multilayer electronic component including a low-pass filter and a balun. The balun disclosed in JP 2003-273685 A includes a first coil and a second coil connected to each other, a third coil having one grounded end and being electromagnetically coupled to the first coil, and a fourth coil having one grounded end and being electromagnetically coupled to the second coil. This balun is a so-called merchant balun.

JP 2019-050460 A discloses a multilayer electronic component including a band-pass filter and a balun. The balun disclosed in JP 2019-050460 A includes first and second phase-shift circuits each including an inductor and a capacitor.

In JP 2019-050460 A, the multilayer electronic component is downsized by arranging two inductors and two capacitors constituting the balun by effectively using space in a stack. However, J P 2019-050460 A does not consider downsizing the multilayer electronic component by devising arrangement of two inductors.

SUMMARY OF THE INVENTION

An object of the present invention is to provide a multilayer electronic component including a balun, the multilayer electronic component capable of being downsized.

The multilayer electronic component of the present invention includes an unbalanced terminal, a first balanced terminal, a second balanced terminal, a first phase-shift circuit including a first inductor provided in a first path connecting the unbalanced terminal and the first balanced terminal, and a first capacitor provided between the first path and a ground in a circuit configuration, a second phase-shift circuit including a second capacitor provided in a second path connecting the unbalanced terminal and the second balanced terminal, and a second inductor provided between the second path and the ground in the circuit configuration, and a stack for integrating the unbalanced terminal, the first balanced terminal, the second balanced terminal, the first phase-shift circuit, and the second phase-shift circuit, the stack including a plurality of dielectric layers and a plurality of conductors stacked together. The first inductor and the second inductor are arranged in a direction parallel to a stacking direction of the plurality of dielectric layers.

In the multilayer electronic component of the present invention, the first inductor and the second inductor are arranged in a direction parallel to the stacking direction of the plurality of dielectric layers. With this, according to the present embodiment, it is possible to implement a multilayer electronic component capable of being downsized.

Other and further objects, features and advantages of the present invention will appear more fully from the following description.

DETAILED DESCRIPTION OF THE PREFERRED EMBODIMENTS

Figure 1:
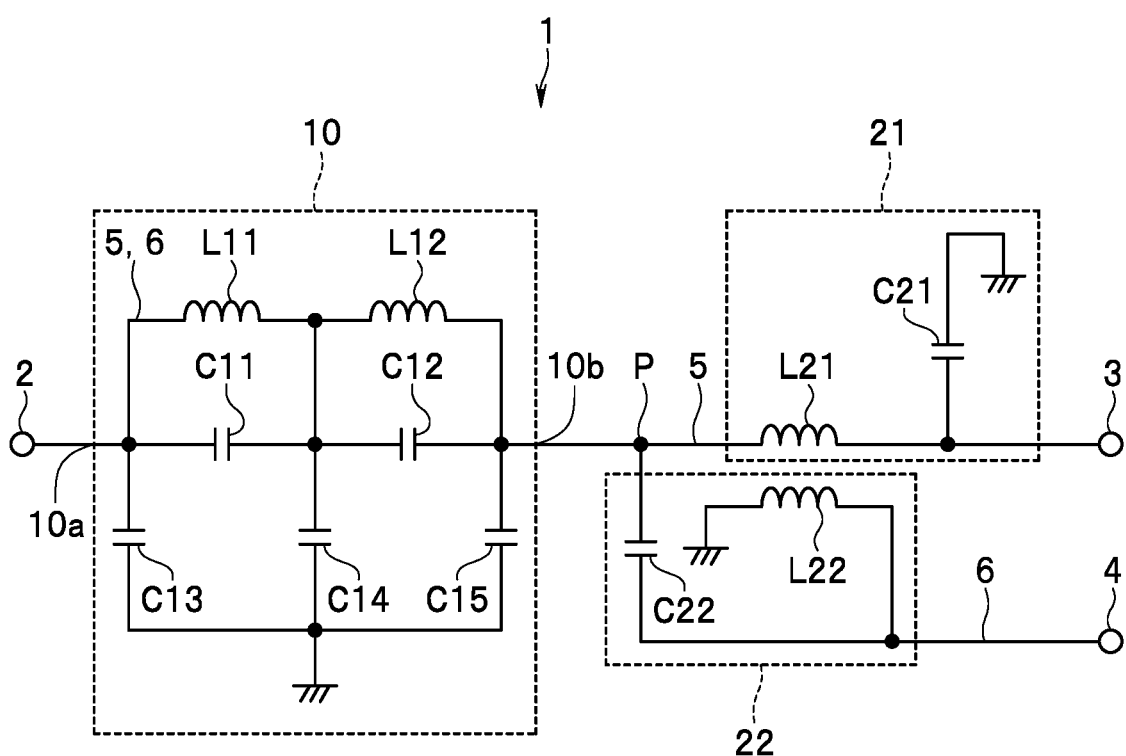
FIG. 1 is a circuit diagram showing a circuit configuration of a multilayer electronic component according to one embodiment of the present invention.

An embodiment of the present invention will be described below in detail with reference to the drawings. First, reference is made to FIG. 1 to outline a configuration of a multilayer electronic component (hereinafter, simply referred to as an electronic component) according to the embodiment of the present invention. FIG. 1 is a circuit diagram showing a circuit configuration of the electronic component 1.

The electronic component 1 includes an unbalanced terminal 2, a first balanced terminal 3, a second balanced terminal 4, a filter 10, a first phase-shift circuit 21, and a second phase-shift circuit 22. The filter 10, the first phase-shift circuit 21, and the second phase-shift circuit 22 are arranged between the unbalanced terminal 2 and the first and second balanced terminals 3 and 4 in a circuit configuration. Note that, in the present application, the expression "in a (the) circuit configuration" is used to indicate a layout in the circuit diagram, instead of a layout in a physical configuration.

The filter 10 is arranged between the unbalanced terminal 2 and the first and second phase-shift circuits 21 and 22 in the circuit configuration. The filter 10 may be a low-pass filter, or may be a filter other than the low-pass filter, such as a band-pass filter.

The first phase-shift circuit 21 and the second phase-shift circuit 22 constitute a balun for performing conversion between an unbalanced signal and a balanced signal. The first phase-shift circuit 21 is designed to delay a phase of a frequency signal in a passband of the filter 10 by 90 degrees or a value close thereto. The second phase-shift circuit 22 is designed to advance a phase of a frequency signal in the passband of the filter 10 by 90 degrees or a value close thereto.

The first phase-shift circuit 21 includes a first inductor L21 provided in a first path 5 connecting the unbalanced terminal 2 and the first balanced terminal 3, and a first capacitor C21 provided between the first path 5 and a ground in the circuit configuration.

The second phase-shift circuit 22 includes a second capacitor C22 provided in a second path 6 connecting the unbalanced terminal 2 and the second balanced terminal 4, and a second inductor L22 provided between the second path 6 and the ground in the circuit configuration.

When a frequency signal in the passband of the filter 10 is input to the unbalanced terminal 2, a phase difference between a first balanced element signal output from the first balanced terminal 3 and a second balanced element signal output from the second balanced terminal 4 is 180 degrees or a value close thereto.

An example of the circuit configuration of the electronic component 1 will be described below with reference to FIG. 1. In the present embodiment, the filter 10 is a low-pass filter. The filter 10 includes inductors L11 and L12 and capacitors C11, C12, C13, C14, and C15.

One end of the inductor L11 is connected to the unbalanced terminal 2. One end of the inductor L12 is connected to the other end of the inductor L11. The capacitor C11 is connected in parallel with the inductor L11. The capacitor C12 is connected in parallel with the inductor L12.

One end of the capacitor C13 is connected to the one end of the inductor L11. One end of the capacitor C14 is connected to a connection point between the inductor L11 and the inductor L12. One end of the capacitor C15 is connected to the other end of the inductor L12. The other end of each of the capacitors C13 to C15 is connected to a ground.

One end of the first inductor L21 of the first phase-shift circuit 21 is connected to the other end of the inductor L12 of the filter 10. The other end of the first inductor L21 is connected to the first balanced terminal 3. One end of the first capacitor C21 of the first phase-shift circuit 21 is connected to the other end of the first inductor L21. The other end of the first capacitor C21 is connected to a ground.

One end of the second capacitor C22 of the second phase-shift circuit 22 is connected to the other end of the inductor L12 of the filter 10. The other end of the second capacitor C22 is connected to the second balanced terminal 4. One end of the second inductor L22 of the second phase-shift circuit 22 is connected to the other end of the second capacitor C22. The other end of the second inductor L22 is connected to a ground.

In the filter 10, the first path 5 and the second path 6 serve as a common path. The inductors L11 and L12 of the filter 10 are provided in this common path. In particular, in the present embodiment, the first path 5 electrically connects the unbalanced terminal 2 to the first balanced terminal 3. Note that, in the present application, the expression "electrically connect" includes electrical connection via a metal conductor (including an inductor), but does not include connection via a capacitor. It can be said that the inductors L11 and L12 are practically provided in the first path 5 electrically connecting the unbalanced terminal 2 to the first balanced terminal 3.

The filter 10 includes a first end 10a closest to the unbalanced terminal 2 in the circuit configuration and a second end 10b farthest from the unbalanced terminal 2 in the circuit configuration. The first path 5 and the second path 6 branch between the second end 10b of the filter 10 and the first and second phase-shift circuits 21 and 22 in the circuit configuration. The first inductor L21 is provided between a branch point P of the first path 5 and the second path 6 and the first balanced terminal 3 in the circuit configuration. The second capacitor C22 is provided between the branch point P of the first path 5 and the second path 6 and the second balanced terminal 4 in the circuit configuration.

Figure 2:
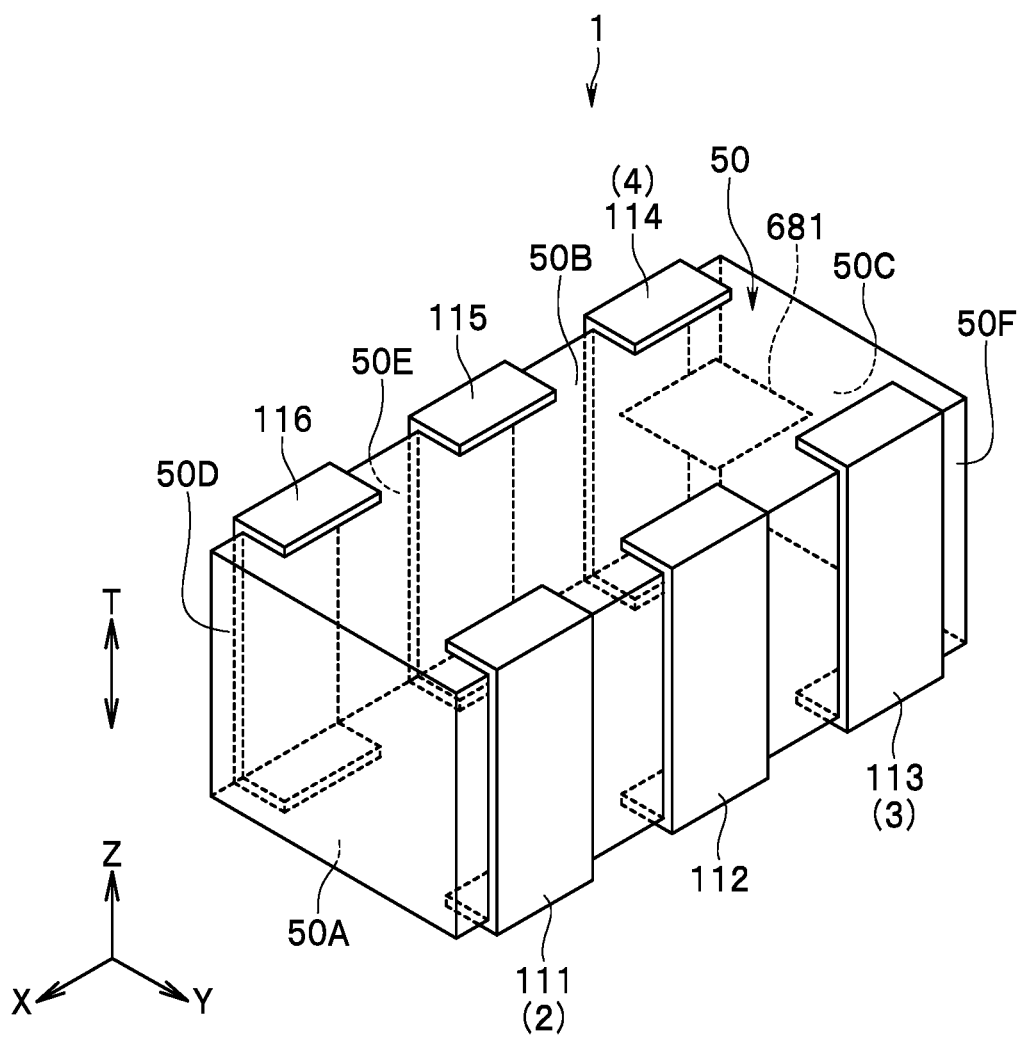
FIG. 2 is a perspective view showing an appearance of the multilayer electronic component according to the embodiment of the present invention.

Next, other configurations of the electronic component 1 will be described with reference to FIG. 2. FIG. 2 is a perspective view showing an appearance of the electronic component 1.

The electronic component 1 further includes a stack 50. The stack 50 includes a plurality of dielectric layers and a plurality of conductors (a plurality of conductor layers and a plurality of through holes) stacked together. The stack 50 is configured to integrate the unbalanced terminal 2, the first balanced terminal 3, the second balanced terminal 4, the filter 10, the first phase-shift circuit 21, and the second phase-shift circuit 22.

The stack 50 includes a first surface 50A and a second surface 50B located at both ends in a stacking direction T of the plurality of dielectric layers, and four side surfaces 50C to 50F connecting the first surface 50A and the second surface 50B. The side surfaces 50C and 50D are opposite to each other. The side surfaces 50E and 50F are opposite to each other. The side surfaces 50C to 50F are perpendicular to the first surface 50A and the second surface 50B.

Here, as shown in FIG. 2, an X direction, a Y direction, and a Z direction are defined. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression "when viewed in the stacking direction T" means that an object is viewed from a position away in the Z direction or the −Z direction.

As shown in FIG. 2, the first surface 50A is located at the end of the stack 50 in the −Z direction. The first surface 50A is also a bottom surface of the stack 50. The first surface 50A faces a mounted body not illustrated, such as a substrate. The second surface 50B is located at the end of the stack 50 in the Z direction. The second surface 50B is also a top surface of the stack 50. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The electronic component 1 further includes electrodes 111, 112, 113, 114, 115, and 116. The electrodes 111 to 113 are arranged in this order in the −X direction on the side surface 50F. In particular, in the present embodiment, each of the electrodes 111 to 113 is arranged to extend from the first surface 50A to the second surface 50B via the side surface 50C. The electrodes 114 to 116 are arranged in this order in the X direction on the side surface 50E. In particular, in the present embodiment, each of the electrodes 114 to 116 is arranged to extend from the first surface 50A to the second surface 50B via the side surface 50D.

The electrode 111 corresponds to the unbalanced terminal 2. The electrode 113 corresponds to the first balanced terminal 3. The electrode 114 corresponds to the second balanced terminal 4. Each of the electrodes 112, 115, and 116 is connected to a ground.

Next, an example of the plurality of dielectric layers and the plurality of conductors (the plurality of conductor layers and the plurality of through holes) constituting the stack 50 will be described with reference to FIG. 3A to FIG. 8C. In this example, the stack 50 includes eighteen dielectric layers stacked together. The eighteen dielectric layers will be referred to as a first to an eighteenth dielectric layer in order from bottom to top. The first to eighteenth dielectric layers are denoted by reference numerals 51 to 68, respectively. Note that in description below, for a connection relationship between the plurality of through holes, the connection relationship in a state where the first to eighteenth dielectric layers 51 to 68 are stacked together will be described.

Figure 3A:
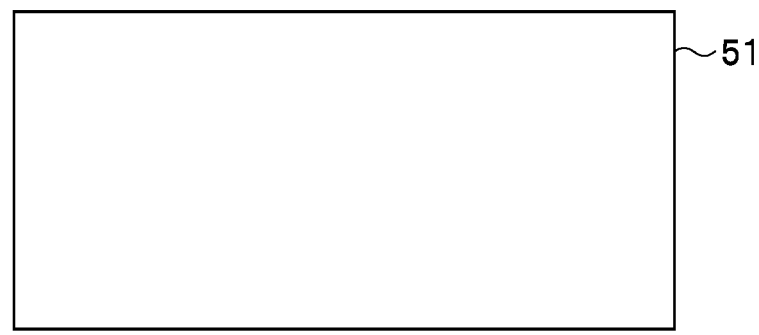
FIGS. 3A to 3C are explanatory diagrams showing respective patterned surfaces of first to third dielectric layers in a stack of the multilayer electronic component according to the embodiment of the present invention.

FIG. 3A shows a patterned surface of the first dielectric layer 51. No conductor layers or through holes are formed in the patterned surface of the dielectric layer 51.

Figure 3B:
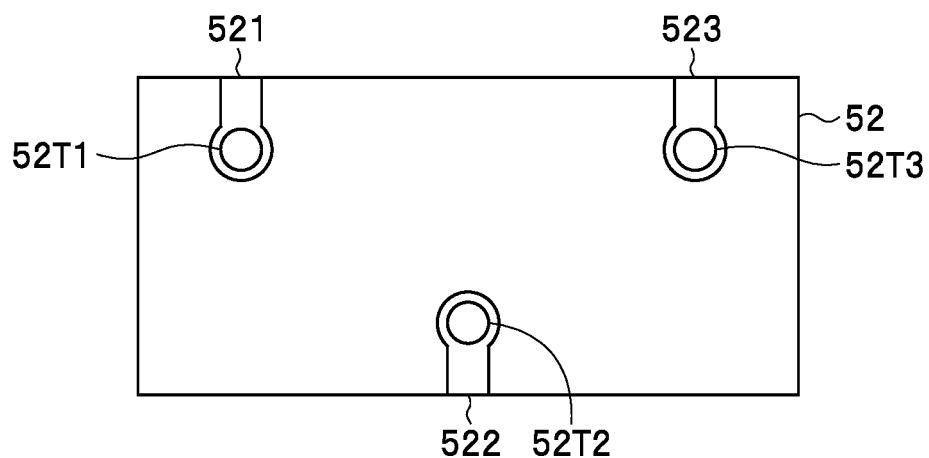

FIG. 3B shows a patterned surface of the second dielectric layer 52. Conductor layers 521, 522, and 523 are formed on the patterned surface of the dielectric layer 52. The conductor layer 521 is connected to the electrode 114 shown in FIG. 2. The conductor layer 522 is connected to the electrode 112 shown in FIG. 2. The conductor layer 523 is connected to the electrode 116 shown in FIG. 2.

Through holes 52T1, 52T2, and 52T3 connected to the conductor layers 521, 522, and 523, respectively, are formed in the dielectric layer 52.

Figure 3C:
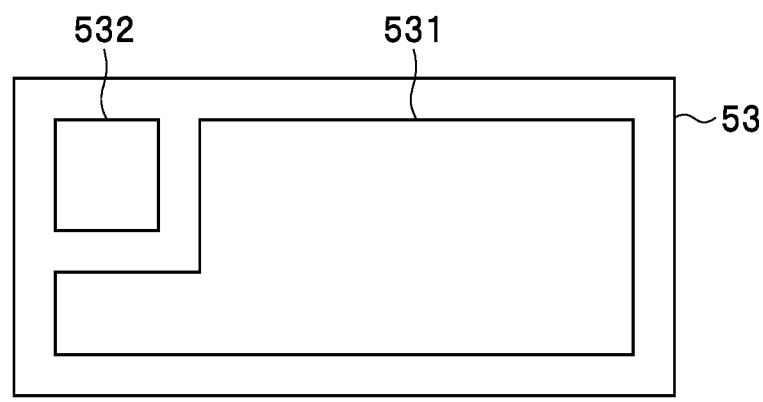

FIG. 3C shows a patterned surface of the third dielectric layer 53. Conductor layers 531 and 532 are formed on the patterned surface of the dielectric layer 53. The through hole 52T1 is connected to the conductor layer 532. The through holes 52T2 and 52T3 are connected to the conductor layer 531.

Figure 4A:
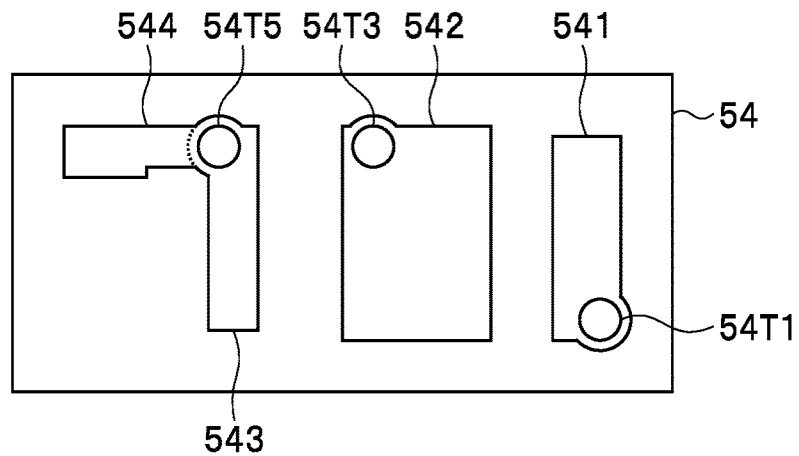
FIGS. 4A to 4C are explanatory diagrams showing respective patterned surfaces of fourth to sixth dielectric layers in the stack of the multilayer electronic component according to the embodiment of the present invention.

FIG. 4A shows a patterned surface of the fourth dielectric layer 54. Conductor layers 541, 542, 543, and 544 are formed on the patterned surface of the dielectric layer 54. The conductor layer 544 is connected to the conductor layer 543. In FIG. 4A, a boundary between the conductor layer 543 and the conductor layer 544 is shown by a dotted line.

Through holes 54T1, 54T3, and 54T5 connected to the conductor layers 541, 542, and 543, respectively, are formed in the dielectric layer 54.

Figure 4B:
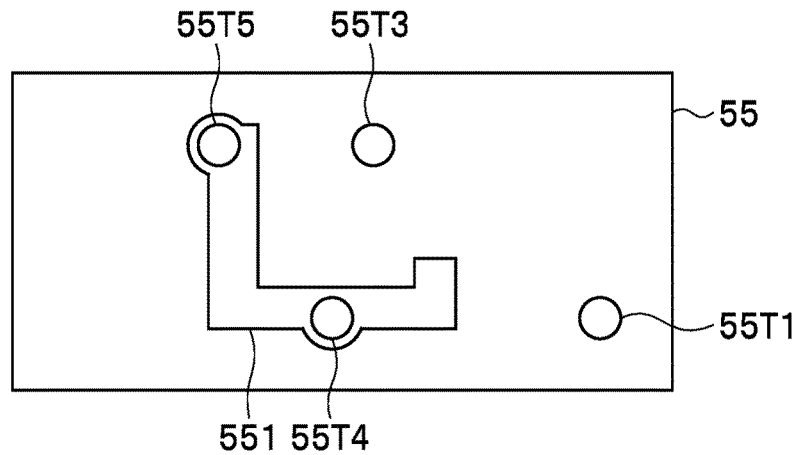

FIG. 4B shows a patterned surface of the fifth dielectric layer 55. A conductor layer 551 is formed on the patterned surface of the dielectric layer 55. Through holes 55T1, 55T3, 55T4, and 55T5 are formed in the dielectric layer 55. The through holes 54T1 and 54T3 are connected to the through holes 55T1 and 55T3, respectively. The through holes 54T5, 55T4, and 55T5 are connected to the conductor layer 551.

Figure 4C:
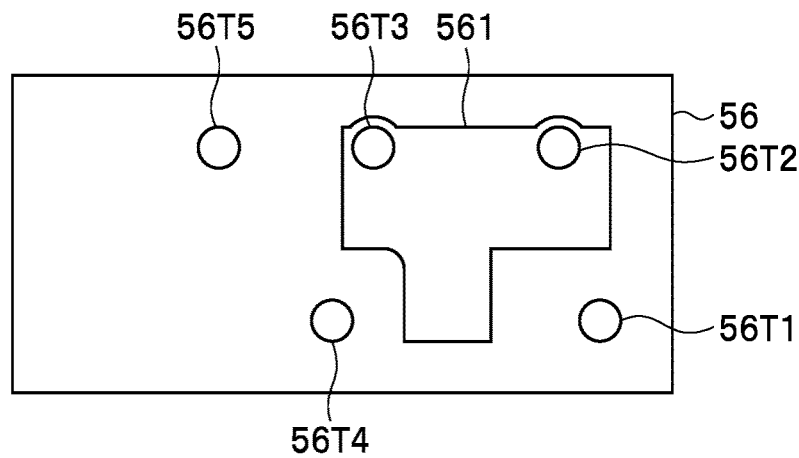

FIG. 4C shows a patterned surface of the sixth dielectric layer 56. A conductor layer 561 is formed on the patterned surface of the dielectric layer 56. Through holes 56T1, 56T2, 56T3, 56T4, and 56T5 are formed in the dielectric layer 56. The through holes 55T1, 55T4, and 55T5 are connected to the through holes 56T1, 56T4, and 56T5, respectively. The through holes 55T3, 56T2, and 56T3 are connected to the conductor layer 561.

Figure 5A:
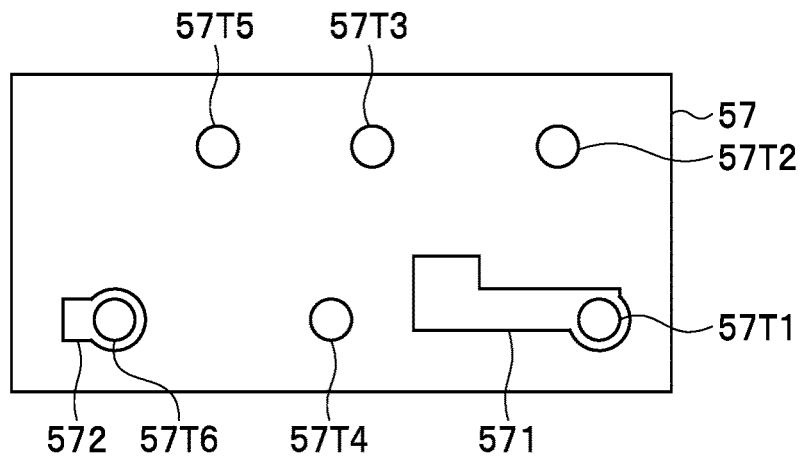
FIGS. 5A to 5C are explanatory diagrams showing respective patterned surfaces of seventh to ninth dielectric layers in the stack of the multilayer electronic component according to the embodiment of the present invention.

FIG. 5A shows a patterned surface of the seventh dielectric layer 57. Conductor layers 571 and 572 are formed on the patterned surface of the dielectric layer 57. Through holes 57T1, 57T2, 57T3, 57T4, 57T5, and 57T6 are formed in the dielectric layer 57. The through holes 56T2 to 56T5 are connected to the through holes 57T2 to 57T5, respectively. The through holes 56T1 and 57T1 are connected to the conductor layer 571. The through hole 57T6 is connected to the conductor layer 572.

Figure 5B:
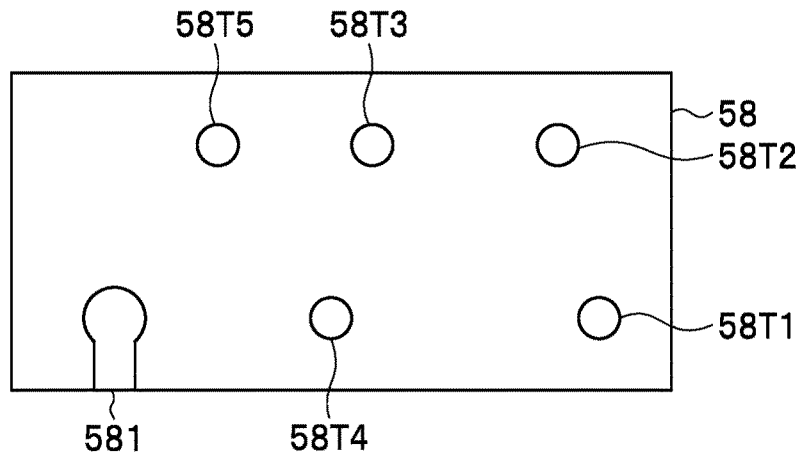

FIG. 5B shows a patterned surface of the eighth dielectric layer 58. A conductor layer 581 is formed on the patterned surface of the dielectric layer 58. The conductor layer 581 is connected to the electrode 113 shown in FIG. 2. The through hole 57T6 is connected to the conductor layer 581. Through holes 58T1, 58T2, 58T3, 58T4, and 58T5 are formed in the dielectric layer 58. The through holes 57T1 to 57T5 are connected to the through holes 58T1 to 58T5, respectively.

Figure 5C:
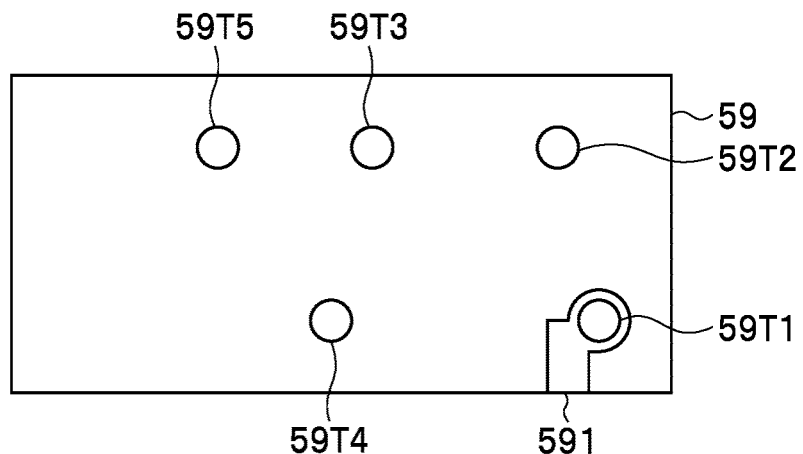

FIG. 5C shows a patterned surface of the ninth dielectric layer 59. A conductor layer 591 is formed on the patterned surface of the dielectric layer 59. The conductor layer 591 is connected to the electrode 111 shown in FIG. 2. Through holes 59T1, 59T2, 59T3, 59T4, and 59T5 are formed in the dielectric layer 59. The through holes 58T1 and 59T1 are connected to the conductor layer 591. The through holes 58T2 to 58T5 are connected to the through holes 59T2 to 59T5, respectively.

Figure 6A:
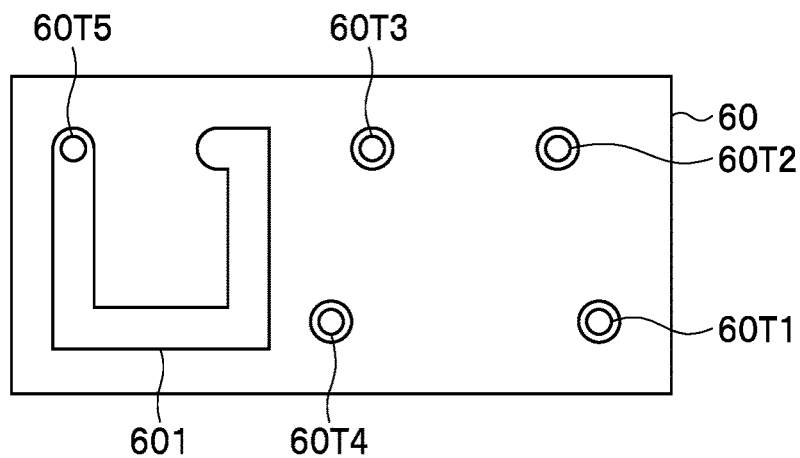
FIGS. 6A to 6C are explanatory diagrams showing respective patterned surfaces of tenth to twelfth dielectric layers in the stack of the multilayer electronic component according to the embodiment of the present invention.

FIG. 6A shows a patterned surface of the tenth dielectric layer 60. A conductor layer 601 is formed on the patterned surface of the dielectric layer 60. The conductor layer 601 includes a first end and a second end opposite to each other in a longitudinal direction of the conductor layer 601. The through hole 59T5 is connected to a portion of the conductor layer 601 near the first end thereof.

Through holes 60T1, 60T2, 60T3, 60T4, and 60T5 are formed in the dielectric layer 60. The through holes 59T1 to 59T4 are connected to the through holes 60T1 to 60T4, respectively. The through hole 60T5 is connected to a portion of the conductor layer 601 near the second end thereof.

Figure 6B:
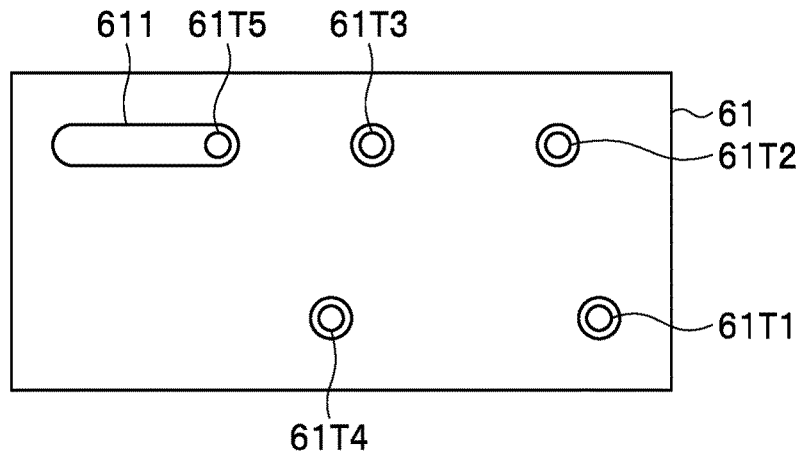

FIG. 6B shows a patterned surface of the eleventh dielectric layer 61. A conductor layer 611 is formed on the patterned surface of the dielectric layer 61. The conductor layer 611 includes a first end and a second end opposite to each other in a longitudinal direction of the conductor layer 611. The through hole 60T5 is connected to a portion of the conductor layer 611 near the first end thereof.

Through holes 61T1, 61T2, 61T3, 61T4, and 61T5 are formed in the dielectric layer 61. The through holes 60T1 to 60T4 are connected to the through holes 61T1 to 61T4, respectively. The through hole 61T5 is connected to a portion of the conductor layer 611 near the second end thereof.

Figure 6C:
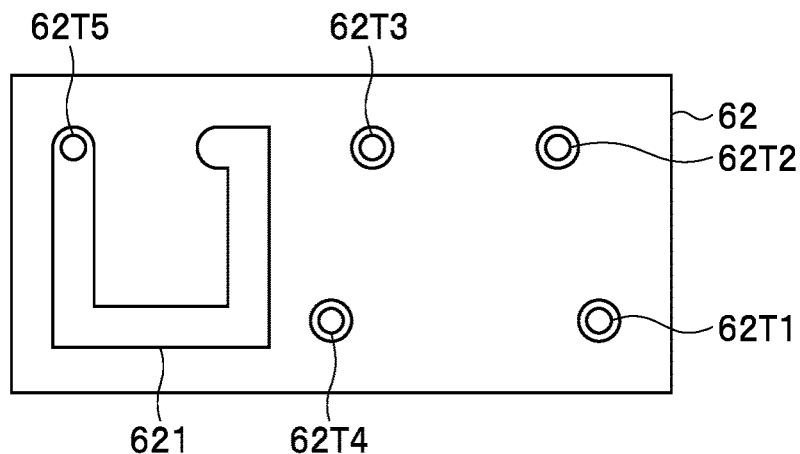

FIG. 6C shows a patterned surface of the twelfth dielectric layer 62. A conductor layer 621 is formed on the patterned surface of the dielectric layer 62. The conductor layer 621 includes a first end and a second end opposite to each other in a longitudinal direction of the conductor layer 621. The through hole 61T5 is connected to a portion of the conductor layer 621 near the first end thereof.

Through holes 62T1, 62T2, 62T3, 62T4, and 62T5 are formed in the dielectric layer 62. The through holes 61T1 to 61T4 are connected to the through holes 62T1 to 62T4, respectively. The through hole 62T5 is connected to a portion of the conductor layer 621 near the second end thereof.

Figure 7A:
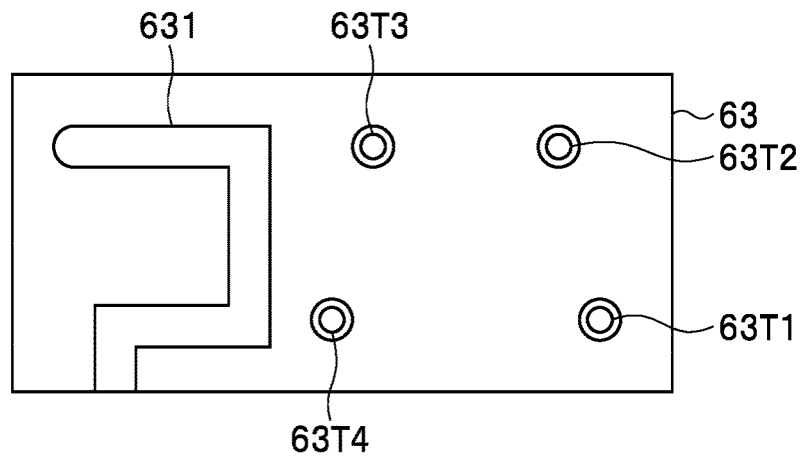
FIGS. 7A to 7C are explanatory diagrams showing respective patterned surfaces of thirteenth to fifteenth dielectric layers in the stack of the multilayer electronic component according to the embodiment of the present invention.

FIG. 7A shows a patterned surface of the thirteenth dielectric layer 63. A conductor layer 631 is formed on the patterned surface of the dielectric layer 63. The conductor layer 631 includes a first end and a second end opposite to each other in a longitudinal direction of the conductor layer 631. The through hole 62T5 is connected to a portion of the conductor layer 631 near the first end thereof. The second end of the conductor layer 631 is connected to the electrode 113 shown in FIG. 2.

Through holes 63T1, 63T2, 63T3, and 63T4 are formed in the dielectric layer 63. The through holes 62T1 to 62T4 are connected to the through holes 63T1 to 63T4, respectively.

Figure 7B:
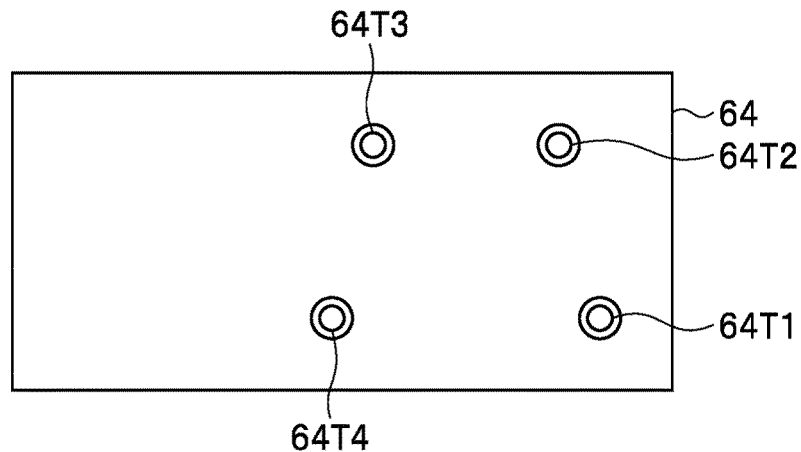

FIG. 7B shows a patterned surface of the fourteenth dielectric layer 64. Through holes 64T1, 64T2, 64T3, and 64T4 are formed in the dielectric layer 64. The through holes 63T1 to 63T4 are connected to the through holes 64T1 to 64T4, respectively.

Figure 7C:
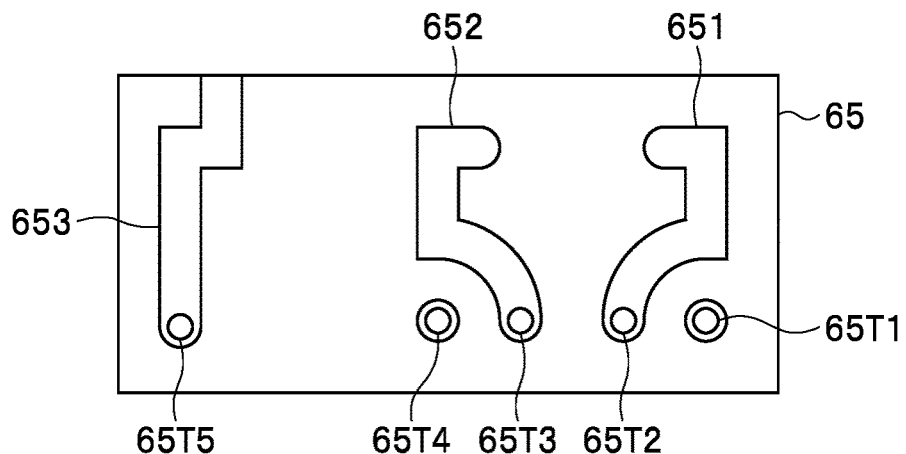

FIG. 7C shows a patterned surface of the fifteenth dielectric layer 65. Conductor layers 651, 652, and 653 are formed on the patterned surface of the dielectric layer 65.

The conductor layer 651 includes a first end and a second end opposite to each other in a longitudinal direction of the conductor layer 651. The through hole 64T2 is connected to a portion of the conductor layer 651 near the first end thereof.

The conductor layer 652 includes a first end and a second end opposite to each other in a longitudinal direction of the conductor layer 652. The through hole 64T3 is connected to a portion of the conductor layer 652 near the first end thereof.

The conductor layer 653 includes a first end and a second end opposite to each other in a longitudinal direction of the conductor layer 653. The first end of the conductor layer 653 is connected to the electrode 114 shown in FIG. 2.

Through holes 65T1, 65T2, 65T3, 65T4, and 65T5 are formed in the dielectric layer 65. The through holes 64T1 and 64T4 are connected to the through holes 65T1 and 65T4, respectively. The through hole 65T2 is connected to a portion of the conductor layer 651 near the second end thereof. The through hole 65T3 is connected to a portion of the conductor layer 652 near the second end thereof. The through hole 65T5 is connected to a portion of the conductor layer 653 near the second end thereof.

Figure 8A:
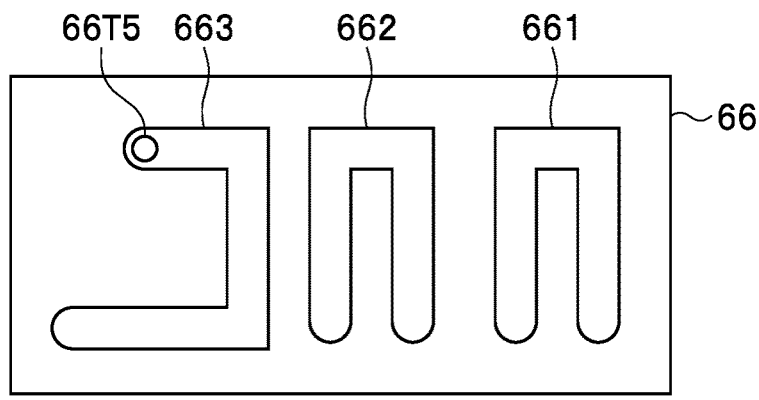
FIGS. 8A to 8C are explanatory diagrams showing respective patterned surfaces of sixteenth to eighteenth dielectric layers in the stack of the multilayer electronic component according to the embodiment of the present invention.

FIG. 8A shows a patterned surface of the sixteenth dielectric layer 66. Conductor layers 661, 662, and 663 are formed on the patterned surface of the dielectric layer 66.

The conductor layer 661 includes a first end and a second end opposite to each other in a longitudinal direction of the conductor layer 661. The through hole 65T1 is connected to a portion of the conductor layer 661 near the first end thereof. The through hole 65T2 is connected to a portion of the conductor layer 661 near the second end thereof.

The conductor layer 662 includes a first end and a second end opposite to each other in a longitudinal direction of the conductor layer 662. The through hole 65T3 is connected to a portion of the conductor layer 662 near the first end thereof. The through hole 65T4 is connected to a portion of the conductor layer 662 near the second end thereof.

The conductor layer 663 includes a first end and a second end opposite to each other in a longitudinal direction of the conductor layer 663. The through hole 65T5 is connected to a portion of the conductor layer 663 near the first end thereof. A through hole 66T5 connected to a portion of the conductor layer 663 near the second end thereof is formed in the dielectric layer 66.

Figure 8B:
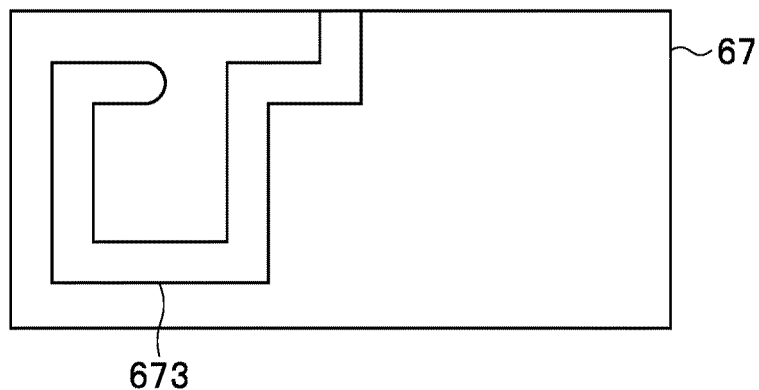

FIG. 8B shows a patterned surface of the seventeenth dielectric layer 67. A conductor layer 673 is formed on the patterned surface of the dielectric layer 67. The conductor layer 673 includes a first end and a second end opposite to each other in a longitudinal direction of the conductor layer 673. The through hole 66T5 is connected to a portion of the conductor layer 673 near the first end thereof. The second end of the conductor layer 673 is connected to the electrode 115 shown in FIG. 2.

Figure 8C:
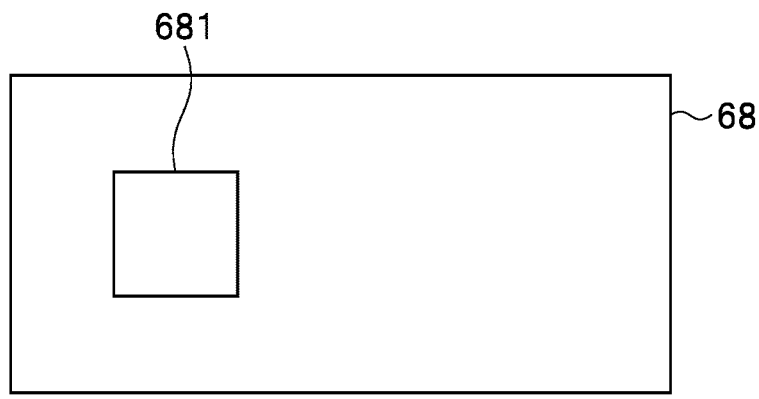

FIG. 8C shows a patterned surface of the eighteenth dielectric layer 68. A mark 681 is formed on the patterned surface of the dielectric layer 68.

The stack 50 shown in FIG. 2 is formed by stacking the first to eighteenth dielectric layers 51 to 68 such that the patterned surface of the first dielectric layer 51 serves as the first surface 50A of the stack 50 and the surface of the eighteenth dielectric layer 68 opposite to the patterned surface thereof serves as the second surface 50B of the stack 50.

Figure 9:
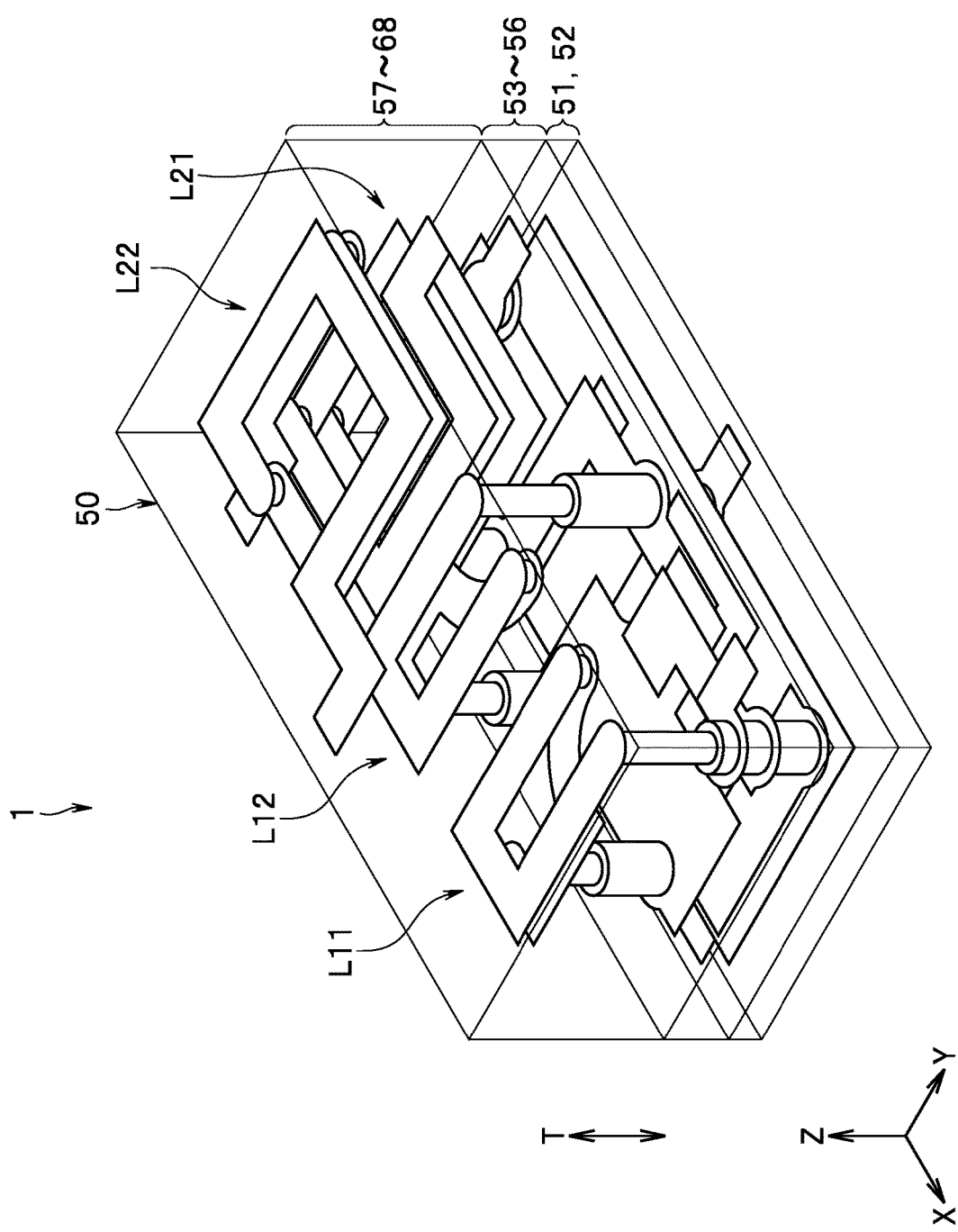
FIG. 9 is a perspective view showing an internal structure of the stack of the multilayer electronic component according to the embodiment of the present invention.

FIG. 9 shows an internal structure of the stack 50 formed by stacking the first to eighteenth dielectric layers 51 to 68. As shown in FIG. 9, the plurality of conductor layers and the plurality of through holes shown in FIGS. 3A to 8B are stacked inside the stack 50. Note that the mark 681 is omitted in FIG. 9.

In the present embodiment, the plurality of dielectric layers constituting the stack 50 include a first dielectric layer and a second dielectric layer having a higher relative permittivity than the first dielectric layer. The relative permittivity of the first dielectric layer (referred to hereinafter as a first relative permittivity) is within a range of 6 to 15, for example. The relative permittivity of the second dielectric layer (referred to hereinafter as a second relative permittivity) is within a range of 20 to 100, for example. For example, as a dielectric material forming the first dielectric layer, a ceramic material having the first relative permittivity is used. For example, as a dielectric material forming the second dielectric layer, a ceramic material having the second relative permittivity is similarly used.

In particular, in the present embodiment, the dielectric layers 51, 52, and 57 to 68 correspond to the first dielectric layer, and the dielectric layers 53 to 56 correspond to the second dielectric layer.

Correspondence between circuit components of the electronic component 1 shown in FIG. 1 and internal components of the stack 50 shown in FIGS. 3A to 8B will be described below. Initially, components of the filter 10 will be described. The inductor L11 is constituted by the conductor layers 651 and 661 and the through hole 65T2. The inductor L12 is constituted by the conductor layers 652 and 662 and the through hole 65T3.

The capacitor C11 is constituted by the conductor layers 561 and 571 and the dielectric layer 56 interposed between those conductor layers. The capacitor C12 is constituted by the conductor layers 542 and 551 and the dielectric layer 54 interposed between those conductor layers.

The capacitor C13 is constituted by the conductor layers 531 and 541 and the dielectric layer 53 interposed between those conductor layers. The capacitor C14 is constituted by the conductor layers 531 and 542 and the dielectric layer 53 interposed between those conductor layers. The capacitor C15 is constituted by the conductor layers 531 and 543 and the dielectric layer 53 interposed between those conductor layers.

Next, the components of the first phase-shift circuit 21 will be described. The first inductor L21 is constituted by the conductor layers 601, 611, 621, and 631 and the through holes 60T5, 61T5, and 62T5. The first capacitor C21 is constituted by the conductor layers 531 and 572 and the dielectric layers 53 to 56 interposed between those conductor layers.

Next, the components of the second phase-shift circuit 22 will be described. The second inductor L22 is constituted by the conductor layers 653, 663, and 673 and the through holes 65T5 and 66T5. The second capacitor C22 is constituted by the conductor layers 532 and 544 and the dielectric layer 53 interposed between those conductor layers.

Next, structural features of the electronic component 1 according to the present embodiment will be described. As shown in FIG. 9, in the present embodiment, the first inductor L21 of the first phase-shift circuit 21 and the second inductor L22 of the second phase-shift circuit 22 are arranged in a direction parallel to the stacking direction T. The first inductor L21 and the second inductor L22 overlap each other when viewed in the stacking direction T.

The plurality of conductors of the stack 50 include a first inductor conductor 210 for forming the first inductor L21 and a second inductor conductor 220 for forming the second inductor L22. In particular, in the present embodiment, the first inductor conductor 210 is a conductor constituted by the conductor layers 601, 611, 621, and 631 and the through holes 60T5, 61T5, and 62T5, and the second inductor conductor 220 is a conductor constituted by the conductor layers 653, 663, and 673 and the through holes 65T5 and 66T5.

Figure 10:
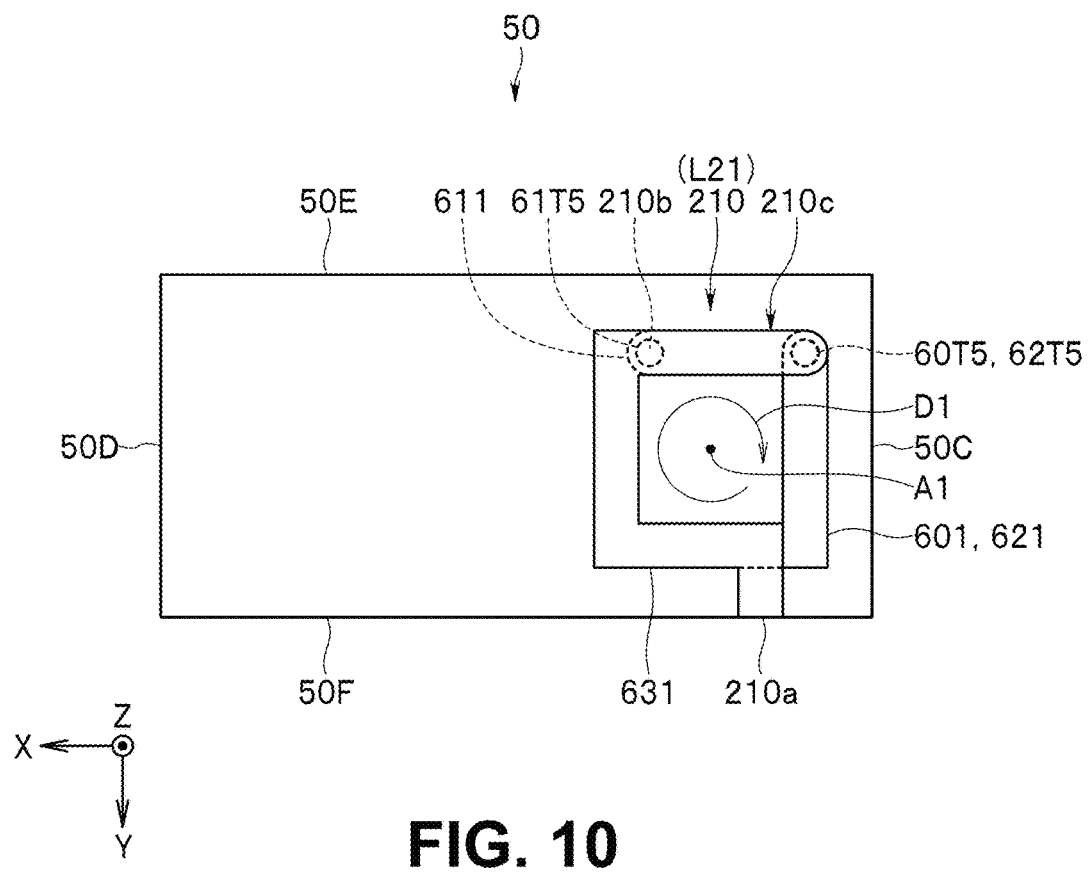
FIG. 10 is a plan view showing a first inductor conductor in the embodiment of the present invention.

FIG. 10 is a plan view showing the first inductor conductor 210 (first inductor L21). The first inductor conductor 210 includes, in the circuit configuration, a first end 210a closest to the first balanced terminal 3, a second end 210b opposite to the first end 210a, and a first winding portion 210c located between the first end 210a and the second end 210b. The first winding portion 210c is wound around a first axis A1 parallel with the stacking direction T.

Specifically, the first end 210a is the second end of the conductor layer 631. The second end of the conductor layer 631 is connected to the electrode 113 corresponding to the first balanced terminal 3. Specifically, the second end 210b is a portion in contact with the through hole 59T5 of the conductor layer 601 (see FIG. 5C).

Figure 11:
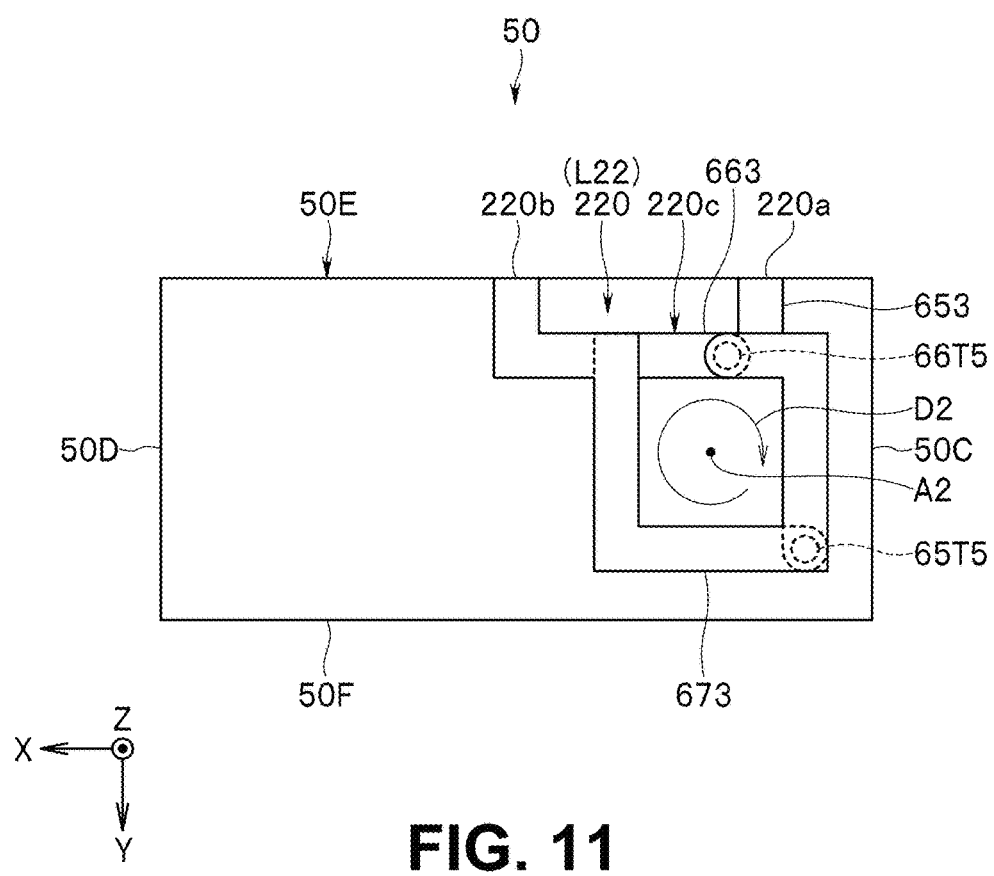
FIG. 11 is a plan view showing a second inductor conductor in the embodiment of the present invention.

FIG. 11 is a plan view showing the second inductor conductor 220 (second inductor L22). The second inductor conductor 220 includes, in the circuit configuration, a third end 220a closest to the second balanced terminal 4, a fourth end 220b opposite to the third end 220a, and a second winding portion 220c located between the third end 220a and the fourth end 220b. The second winding portion 220c is wound around a second axis A2 parallel with the stacking direction T.

Specifically, the third end 220a is the first end of the conductor layer 653. The first end of the conductor layer 653 is connected to the electrode 114 corresponding to the second balanced terminal 4. Specifically, the fourth end 220b is the second end of the conductor layer 673. The second end of the conductor layer 673 is connected to the electrode 115 connected to a ground.

In FIG. 10, an arrow with reference sign D1 represents a direction of the first winding portion 210c when viewed in the stacking direction T in a case where the first winding portion 210c goes from the first end 210a to the second end 210b in the first inductor conductor 210. The direction D1 represents a rotational direction around the first axis A1. In FIG. 11, an arrow with reference sign D2 represents a direction of the second winding portion 220c when viewed in the stacking direction T in a case where the second winding portion 220c goes from the third end 220a to the fourth end 220b in the second inductor conductor 220. The direction D2 represents a rotational direction around the second axis A2. As understood from FIGS. 10 and 11, the direction D1 and the direction D2 are the same direction.

In the present embodiment, the conductor layer 673 constituting the second inductor L22 is connected to the electrode 115. The electrode 115 is connected to a ground. Hereinafter, the electrode 115 will also be referred to as a first ground terminal. The conductor layer 531 constituting the capacitors C13 to C15 is connected to the electrode 112 via the through hole 52T2 and the conductor layer 522. The electrode 112 is connected to a ground. Hereinafter, the electrode 112 will also be referred to as a second ground terminal. In the present embodiment, the first ground terminal 115 and the second ground terminal 112 are not electrically connected to each other in the stack 50.

In the present embodiment, a part of the conductor layer 673 constituting the second inductor L22 and a part of each of the conductor layers 652 and 662 constituting the inductor L12 overlap each other when viewed in the stacking direction T.

Figure 12:
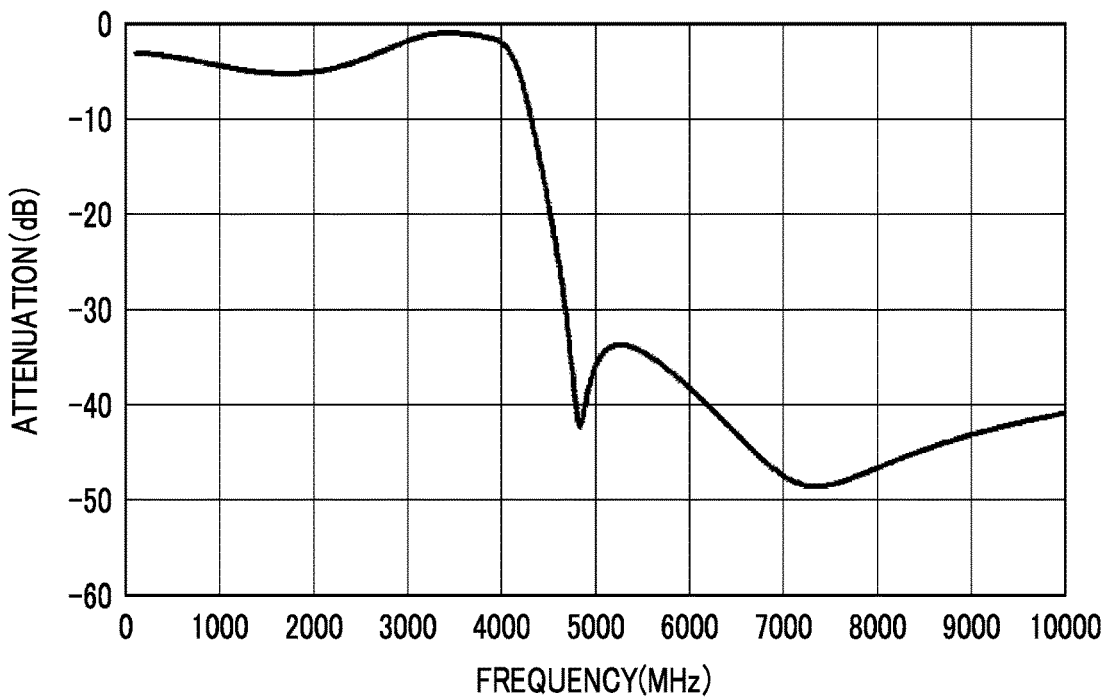
FIG. 12 is a characteristic diagram showing frequency characteristics of insertion loss of the multilayer electronic component according to the embodiment of the present invention.

Next, an example of characteristics of the electronic component 1 computed by simulation will be described. FIG. 12 shows frequency characteristics of insertion loss of the electronic component 1 in a case where an unbalanced signal is input to the unbalanced terminal 2. In FIG. 12, the horizontal axis represents frequency, and the vertical axis represents attenuation.

Figure 13:
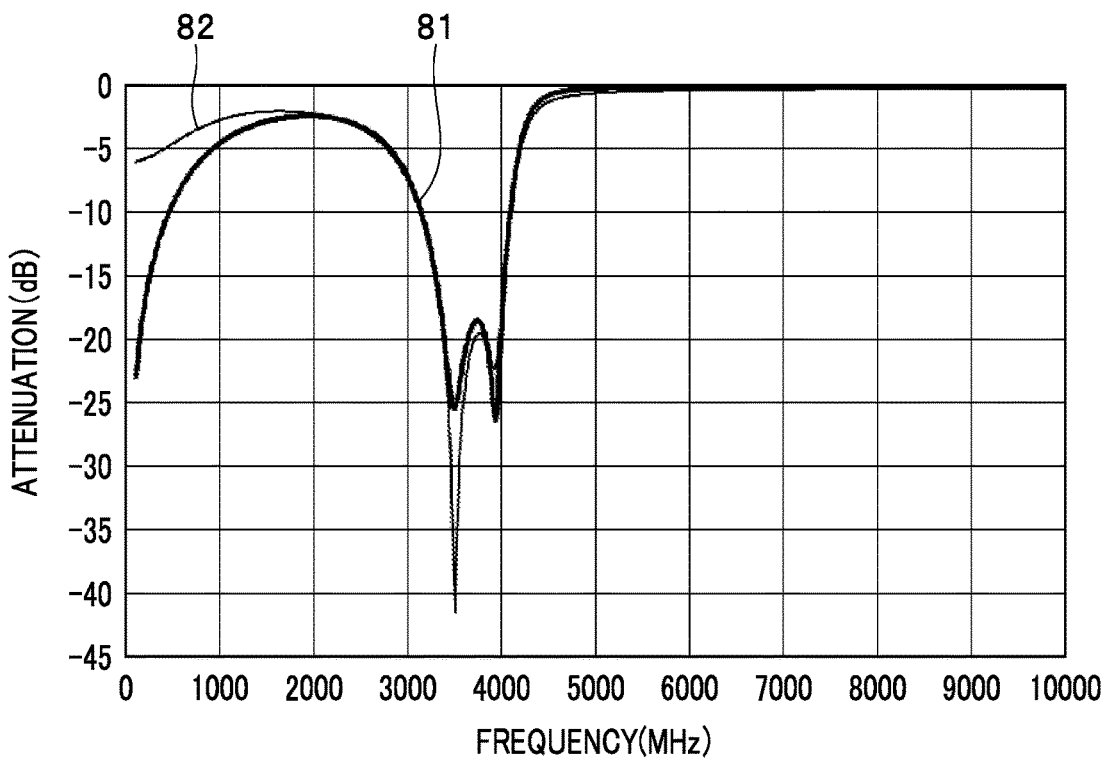
FIG. 13 is a characteristic diagram showing frequency characteristics of reflection loss of the multilayer electronic component according to the embodiment of the present invention.

FIG. 13 shows frequency characteristics of reflection loss of the electronic component 1. In FIG. 13, the horizontal axis represents frequency, and the vertical axis represents attenuation. In FIG. 13, a curved line with reference numeral 81 represents reflection loss of the unbalanced terminal 2, and a curved line with reference numeral 82 represents reflection loss of the first balanced terminal 3.

Based on FIGS. 12 and 13, it is clear that the electronic component 1 functions as a low-pass filter having a passband including a frequency band of 3300 to 3800 MHz.

Figure 14:
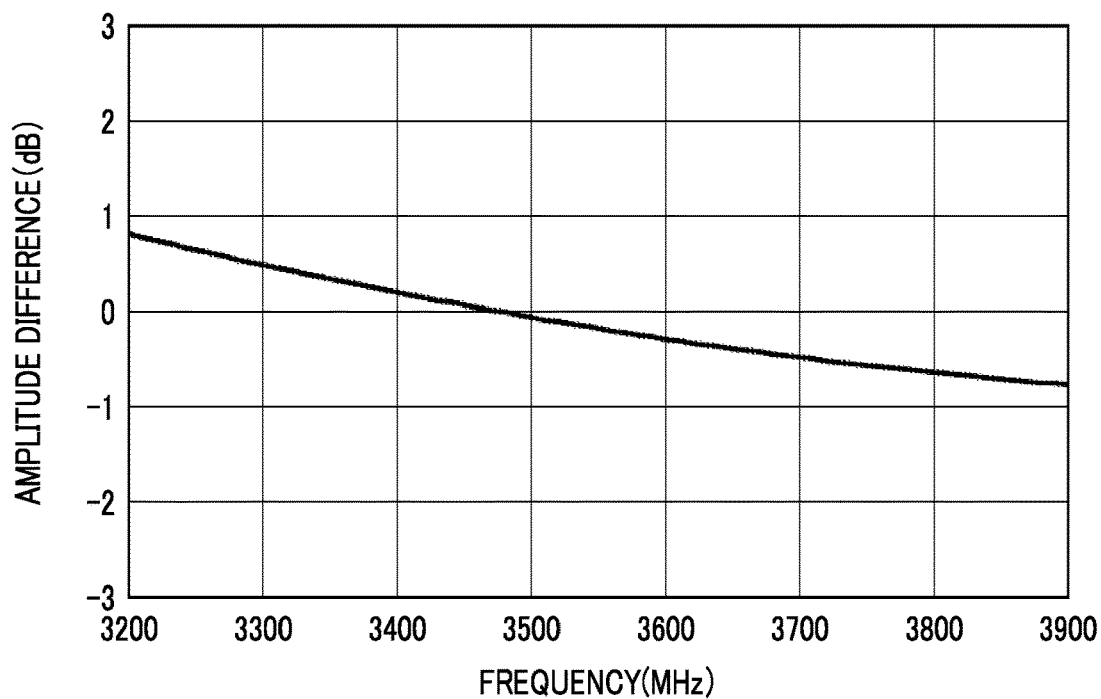
FIG. 14 is a characteristic diagram showing amplitude balance characteristics of the multilayer electronic component according to the embodiment of the present invention.

FIG. 14 shows amplitude balance characteristics of the electronic component 1. Here, the amplitude balance characteristics of the electronic component 1 are represented by using a difference between amplitudes of the first and second balanced element signals output from the first and second balanced terminals 3 and 4 when an unbalanced signal is input to the unbalanced terminal 2 (the difference will hereinafter be simply referred to as an amplitude difference). The amplitude difference is expressed in positive values when the amplitude of the second balanced element signal is greater than the amplitude of the first balanced element signal, and is expressed in negative values when the amplitude of the second balanced element signal is smaller than the amplitude of the first balanced element signal. In FIG. 14, the horizontal axis represents frequency, and the vertical axis represents amplitude difference.

As shown in FIG. 14, the amplitude difference in the above-mentioned frequency band is close to 0 (dB). Thus, the amplitude balance characteristics of the electronic component 1 are satisfactory.

Figure 15:
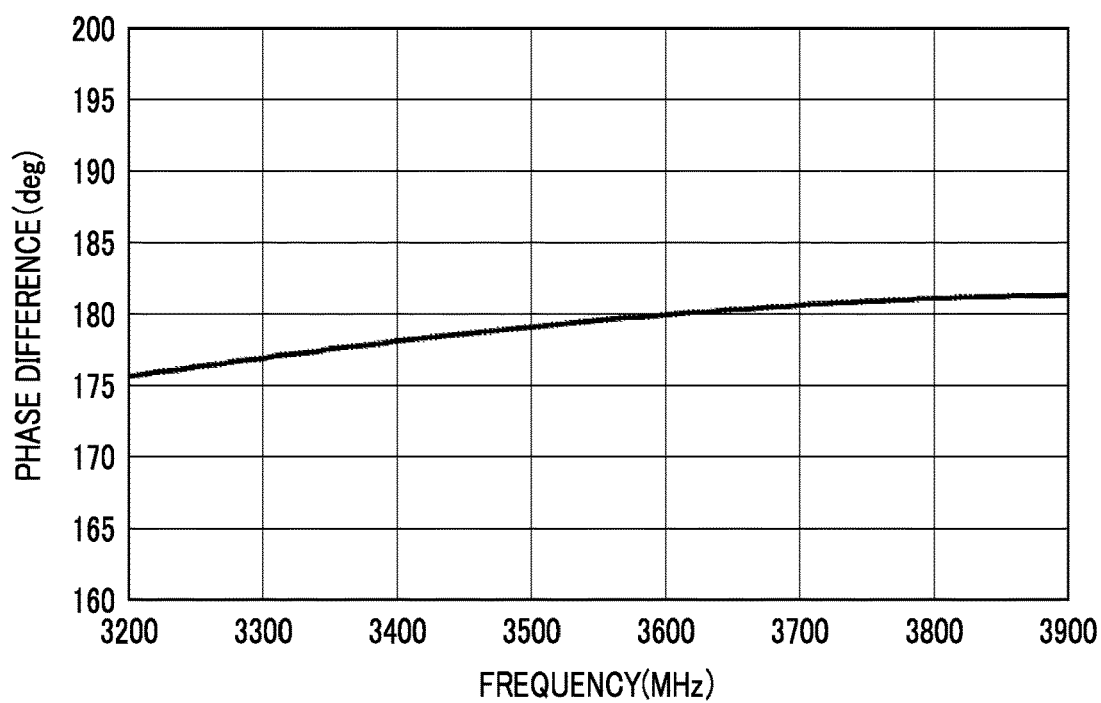
FIG. 15 is a characteristic diagram showing phase balance characteristics of the multilayer electronic component according to the embodiment of the present invention.

FIG. 15 shows phase balance characteristics of the electronic component 1. Here, the phase balance characteristics of the electronic component 1 are represented by using a difference between phases of the first and second balanced element signals output from the first and second balanced terminals 3 and 4 when an unbalanced signal is input to the unbalanced terminal 2 (the difference will hereinafter be simply referred to as a phase difference). The phase difference represents the magnitude of advancement of the phase of the second balanced element signal relative to the phase of the first balanced element signal. In FIG. 15, the horizontal axis represents frequency, and the vertical axis represents phase difference.

As shown in FIG. 15, the phase difference in the above-mentioned frequency band is close to 180 degrees (deg). Thus, the phase balance characteristics of the electronic component 1 are satisfactory.

Next, the operation and effects of the electronic component 1 according to the present embodiment will be described. In the present embodiment, the first inductor L21 and the second inductor L22 are arranged in parallel with the stacking direction T. With this, according to the present embodiment, it is possible to reduce a planar shape (shape when viewed in the stacking direction T) of the electronic component 1 as compared to that in a case where the first inductor L21 and the second inductor L22 are arranged in a direction orthogonal to the stacking direction T.

In the present embodiment, the stack 50 includes the dielectric layers 51, 52, and 57 to 68 and the dielectric layers 53 to 56 having a higher relative permittivity than the dielectric layers 51, 52, and 57 to 68. The stack 50 further includes a plurality of capacitor conductor layers for forming the capacitors C11 to C15, C21, and C22. Each of the plurality of capacitor conductor layers is in contact with any one of the dielectric layers 53 to 56. According to the present embodiment, the capacitors C11 to C15, C21, and C22 are constituted by the plurality of capacitor conductor layers and the dielectric layers 53 to 56 having the higher relative permittivity, thereby allowing an area of each of the plurality of capacitor conductor layers to be reduced. With this, according to the present embodiment, the electronic component 1 can be downsized.

In the present embodiment, the first and second inductors L21 and L22 (first and second inductor conductors 210 and 220) are arranged between the dielectric layers 53 to 56 and the second surface 50B of the stack 50 in the stack 50. The second surface 50B is a surface opposite to the first surface 50A facing the mounted body. With this, according to the present embodiment, it is possible to suppress reduction in Q values of the first and second inductors L21 and L22 due to a conductor included in the mounted body.

In the present embodiment, the conductor layer 673 constituting the second inductor L22 of the second phase-shift circuit 22 is connected to the first ground terminal 115, and the conductor layer 531 constituting the capacitors C13 to C15 of the filter 10 is connected to the second ground terminal 112. The first ground terminal 115 and the second ground terminal 112 are not electrically connected to each other in the stack 50. With this, according to the present embodiment, it is possible to prevent characteristics of the electronic component 1 from deteriorating due to coupling of the filter 10 and the second phase-shift circuit 22.

In the present embodiment, a part of the conductor layer 673 constituting the second inductor L22 and a part of each of the conductor layers 652 and 662 constituting the inductor L12 overlap each other when viewed in the stacking direction T. In other words, in the present embodiment, a part of the filter 10 and a part of the second phase-shift circuit 22 (balun) overlap each other when viewed in the stacking direction T. With this, according to the present embodiment, the electronic component 1 can be downsized as compared to that in a case where the filter 10 and the balun do not overlap each other.

The present invention is not limited to the foregoing embodiment, and various modifications may be made thereto. For example, in the embodiment, the filter 10 is the low-pass filter, but may be a filter other than the low-pass filter, such as a band-pass filter. In place of the filter 10, the electronic component 1 may include an arbitrary circuit for handling an unbalanced signal.

As described above, the multilayer electronic component of the present invention includes an unbalanced terminal, a first balanced terminal, a second balanced terminal, a first phase-shift circuit including a first inductor provided in a first path connecting the unbalanced terminal and the first balanced terminal, and a first capacitor provided between the first path and a ground in a circuit configuration, a second phase-shift circuit including a second capacitor provided in a second path connecting the unbalanced terminal and the second balanced terminal, and a second inductor provided between the second path and the ground in the circuit configuration, and a stack for integrating the unbalanced terminal, the first balanced terminal, the second balanced terminal, the first phase-shift circuit, and the second phase-shift circuit, the stack including a plurality of dielectric layers and a plurality of conductors stacked together. The first inductor and the second inductor are arranged in a direction parallel to a stacking direction of the plurality of dielectric layers.

In the multilayer electronic component of the present invention, the first inductor and the second inductor may overlap each other when viewed in the stacking direction.

In the multilayer electronic component of the present invention, the plurality of dielectric layers may include a first dielectric layer and a second dielectric layer having a higher relative permittivity than the first dielectric layer. The plurality of conductors may include a plurality of capacitor conductor layers for forming the first capacitor and the second capacitor. At least one of the plurality of capacitor conductor layers may be in contact with the second dielectric layer.

In the multilayer electronic component of the present invention, the stack may include a first surface facing a mounted body, and a second surface opposite to the first surface. The first inductor, the second inductor, and the first dielectric layer may be provided between the second dielectric layer and the second surface.

In the multilayer electronic component of the present invention, the plurality of conductors may include a first inductor conductor for forming the first inductor and a second inductor conductor for forming the second inductor. The first inductor conductor may include, in the circuit configuration, a first end closest to the first balanced terminal, a second end opposite to the first end, and a first winding portion located between the first end and the second end. The second inductor conductor may include, in the circuit configuration, a third end closest to the second balanced terminal, a fourth end opposite to the third end, and a second winding portion located between the third end and the fourth end. The first winding portion may be wound around a first axis parallel with the stacking direction. The second winding portion may be wound around a second axis parallel with the stacking direction. A direction of the first winding portion when viewed in the stacking direction in a case where the first winding portion goes from the first end to the second end in the first inductor conductor may be the same as a direction of the second winding portion when viewed in the stacking direction in a case where the second winding portion goes from the third end to the fourth end in the second inductor conductor.

The multilayer electronic component of the present invention may further include a filter including a third capacitor, the filter being provided between the unbalanced terminal and the first and second phase-shift circuits in the circuit configuration. The multilayer electronic component of the present invention may further include a first ground terminal to which the second inductor is connected and a second ground terminal to which the third capacitor is connected. The first ground terminal and the second ground terminal may not be electrically connected to each other in the stack.

The multilayer electronic component of the present invention may further include a low-pass filter including a third inductor provided in the first path.

The multilayer electronic component of the present invention may further include a filter including a third inductor, the filter being provided between the unbalanced terminal and the first and second phase-shift circuits in the circuit configuration. A part of at least one of the first inductor and the second inductor and a part of the third inductor may overlap each other when viewed in the stacking direction.

In the multilayer electronic component of the present invention, the first and second phase-shift circuits may constitute a balun.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. A multilayer electronic component comprising:
an unbalanced terminal;
a first balanced terminal;
a second balanced terminal;
a first phase-shift circuit including a first inductor provided in a first path connecting the unbalanced terminal and the first balanced terminal, and a first capacitor provided between the first path and a ground in a circuit configuration;
a second phase-shift circuit including a second capacitor provided in a second path connecting the unbalanced terminal and the second balanced terminal, and a second inductor provided between the second path and the ground in the circuit configuration; and
a stack for integrating the unbalanced terminal, the first balanced terminal, the second balanced terminal, the first phase-shift circuit, and the second phase-shift circuit, the stack including a plurality of dielectric layers and a plurality of conductors stacked together, wherein
the first inductor and the second inductor are arranged in a direction parallel to a stacking direction of the plurality of dielectric layers, and the first inductor and the second inductor overlap each other when viewed in the stacking direction.

2. The multilayer electronic component according to claim 1, wherein
the first phase-shift circuit and the second phase-shift circuit constitute a balun.

3. The multilayer electronic component according to claim 1, wherein
the plurality of dielectric layers include a first dielectric layer and a second dielectric layer having a higher relative permittivity than the first dielectric layer,
the plurality of conductors include a plurality of capacitor conductor layers for forming the first capacitor and the second capacitor, and
at least one of the plurality of capacitor conductor layers is in contact with the second dielectric layer.

4. The multilayer electronic component according to claim 3, wherein
the stack includes a first surface facing a mounted body, and a second surface opposite to the first surface, and
the first inductor, the second inductor, and the first dielectric layer are provided between the second dielectric layer and the second surface.

5. The multilayer electronic component according to claim 1, wherein
the plurality of conductors include a first inductor conductor for forming the first inductor and a second inductor conductor for forming the second inductor,
the first inductor conductor includes, in the circuit configuration, a first end closest to the first balanced terminal, a second end opposite to the first end, and a first winding portion located between the first end and the second end,
the second inductor conductor includes, in the circuit configuration, a third end closest to the second balanced terminal, a fourth end opposite to the third end, and a second winding portion located between the third end and the fourth end,
the first winding portion is wound around a first axis parallel with the stacking direction,
the second winding portion is wound around a second axis parallel with the stacking direction, and
a direction of the first winding portion when viewed in the stacking direction in a case where the first winding portion goes from the first end to the second end in the first inductor conductor is the same as a direction of the second winding portion when viewed in the stacking direction in a case where the second winding portion goes from the third end to the fourth end in the second inductor conductor.

6. The multilayer electronic component according to claim 1, further comprising a filter including a third capacitor, the filter being provided between the unbalanced terminal and the first and second phase-shift circuits in the circuit configuration.

7. The multilayer electronic component according to claim 6, further comprising:
   a first ground terminal to which the second inductor is connected; and
   a second ground terminal to which the third capacitor is connected, wherein
   the first ground terminal and the second ground terminal are not electrically connected to each other in the stack.

8. The multilayer electronic component according to claim 1, further comprising a low-pass filter including a third inductor provided in the first path.

9. The multilayer electronic component according to claim 1, further comprising
   a filter including a third inductor, the filter being provided between the unbalanced terminal and the first and second phase-shift circuits in the circuit configuration, wherein
   a part of at least one of the first inductor and the second inductor and a part of the third inductor overlap each other when viewed in the stacking direction.

10. A multilayer electronic component comprising:
    an unbalanced terminal;
    a first balanced terminal;
    a second balanced terminal;
    a first phase-shift circuit including a first inductor provided in a first path connecting the unbalanced terminal and the first balanced terminal, and a first capacitor provided between the first path and a ground in a circuit configuration;
    a second phase-shift circuit including a second capacitor provided in a second path connecting the unbalanced terminal and the second balanced terminal, and a second inductor provided between the second path and the ground in the circuit configuration;
    a low-pass filter including a third inductor provided in the first path; and
    a stack for integrating the unbalanced terminal, the first balanced terminal, the second balanced terminal, the first phase-shift circuit, the second phase-shift circuit, and the low-pass filter, the stack including a plurality of dielectric layers and a plurality of conductors stacked together, wherein
    the first inductor and the second inductor are arranged in a direction parallel to a stacking direction of the plurality of dielectric layers.

11. A multilayer electronic component comprising:
    an unbalanced terminal;
    a first balanced terminal;
    a second balanced terminal;
    a first phase-shift circuit including a first inductor provided in a first path connecting the unbalanced terminal and the first balanced terminal, and a first capacitor provided between the first path and a ground in a circuit configuration;
    a second phase-shift circuit including a second capacitor provided in a second path connecting the unbalanced terminal and the second balanced terminal, and a second inductor provided between the second path and the ground in the circuit configuration;
    a filter including a third capacitor, the filter being provided between the unbalanced terminal and the first and second phase-shift circuits in the circuit configuration; and
    a stack for integrating the unbalanced terminal, the first balanced terminal, the second balanced terminal, the first phase-shift circuit, the second phase-shift circuit, and the filter, the stack including a plurality of dielectric layers and a plurality of conductors stacked together, wherein
    the first inductor and the second inductor are arranged in a direction parallel to a stacking direction of the plurality of dielectric layers.

* * * * *